United States Patent
Yang et al.

(10) Patent No.: US 12,463,087 B2
(45) Date of Patent: *Nov. 4, 2025

(54) FinFET CIRCUIT DEVICES WITH WELL ISOLATION

(71) Applicant: Taiwan Semiconductor Manufacturing Co., Ltd., Hsin-Chu (TW)

(72) Inventors: Chih-Chuan Yang, Hsinchu (TW); Chang-Ta Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/609,639

(22) Filed: Mar. 19, 2024

(65) Prior Publication Data

US 2024/0222188 A1    Jul. 4, 2024

Related U.S. Application Data

(60) Continuation of application No. 17/682,425, filed on Feb. 28, 2022, now Pat. No. 11,948,829, which is a
(Continued)

(51) Int. Cl.
*H01L 21/762* (2006.01)
*H01L 21/3065* (2006.01)
*H10B 10/00* (2023.01)

(52) U.S. Cl.
CPC .... *H01L 21/76224* (2013.01); *H01L 21/3065* (2013.01); *H01L 21/76232* (2013.01); *H10B 10/12* (2023.02)

(58) Field of Classification Search
None
See application file for complete search history.

(56) References Cited

U.S. PATENT DOCUMENTS 8,772,109 B2   7/2014   Colinge
8,785,285 B2   7/2014   Tsai
(Continued)

FOREIGN PATENT DOCUMENTS

CN    105575878 A      5/2016
CN    106571341 A *    4/2017
(Continued)

*Primary Examiner* — Telly D Green
(74) *Attorney, Agent, or Firm* — HAYNES AND BOONE, LLP

(57) ABSTRACT

A method includes receiving a structure that includes a substrate including a first well region having a first dopant type and a second well region having a second dopant type that is opposite to the first dopant type; and fins extending above the substrate. The method further includes forming a patterned etch mask on the structure, wherein the patterned etch mask provides an opening that is directly above a first fin of the fins, wherein the first fin is directly above the first well region. The method further includes etching the structure through the patterned etch mask, wherein the etching removes the first fin and forms a recess in the substrate that spans from the first well region into the second well region; and forming a dielectric material between remaining portions of the fins and within the recess.

20 Claims, 12 Drawing Sheets

Related U.S. Application Data division of application No. 16/450,278, filed on Jun. 24, 2019, now Pat. No. 11,264,268.

(60) Provisional application No. 62/772,658, filed on Nov. 29, 2018.

(56) References Cited

U.S. PATENT DOCUMENTS

| | | |
|---|---|---|
| 8,816,444 B2 | 8/2014 | Wann |
| 8,823,065 B2 | 9/2014 | Wang |
| 8,860,148 B2 | 10/2014 | Hu |
| 9,105,490 B2 | 8/2015 | Wang |
| 9,147,730 B2 | 9/2015 | Xie |
| 9,236,267 B2 | 1/2016 | De |
| 9,236,300 B2 | 1/2016 | Liaw |
| 9,324,827 B1 | 4/2016 | Singh |
| 9,349,730 B2 | 5/2016 | Jacob |
| 9,368,388 B2 | 6/2016 | Liaw |
| 9,455,198 B1 | 9/2016 | Yu |
| 9,520,482 B1 | 12/2016 | Chang |
| 9,570,339 B2 | 2/2017 | Liou |
| 9,576,814 B2 | 2/2017 | Wu |
| 9,899,267 B1 | 2/2018 | Liou |
| 9,946,827 B2 | 4/2018 | Wang |
| 10,103,142 B2 | 10/2018 | Sung |
| 10,199,279 B2 | 2/2019 | You |
| 10,319,581 B1 | 6/2019 | Wen |
| 10,522,417 B2 | 12/2019 | Cheng |
| 10,727,343 B2 | 7/2020 | Lin |
| 2013/0270652 A1 | 10/2013 | Liaw |
| 2014/0227857 A1 | 8/2014 | Youn |
| 2015/0021690 A1 | 1/2015 | Jacob |
| 2016/0093714 A1 | 3/2016 | Wang |
| 2016/0225906 A1 | 8/2016 | Wang |
| 2016/0351411 A1 | 12/2016 | Xie |
| 2016/0351565 A1 | 12/2016 | Sung |
| 2017/0194323 A1 | 7/2017 | Liaw |
| 2017/0323942 A1 | 11/2017 | Voldman |
| 2018/0315664 A1 | 11/2018 | Cheng |
| 2019/0015719 A1 | 1/2019 | Takeuchi |
| 2019/0027588 A1 | 1/2019 | Liou |
| 2019/0097035 A1 | 3/2019 | Lin |
| 2019/0131186 A1 | 5/2019 | Chung |
| 2019/0198648 A1 | 6/2019 | Kang |
| 2019/0267372 A1 | 8/2019 | Wen |
| 2020/0013683 A1 | 1/2020 | Zhou |
| 2020/0150561 A1 | 5/2020 | Itabashi |
| 2020/0258881 A1 | 8/2020 | Lilak |

FOREIGN PATENT DOCUMENTS

| | | |
|---|---|---|
| JP | 2016534572 A | 11/2016 |
| KR | 20030001881 A | 1/2003 |
| KR | 20160100210 A | 8/2016 |
| KR | 20180120559 A | 11/2018 |

\* cited by examiner

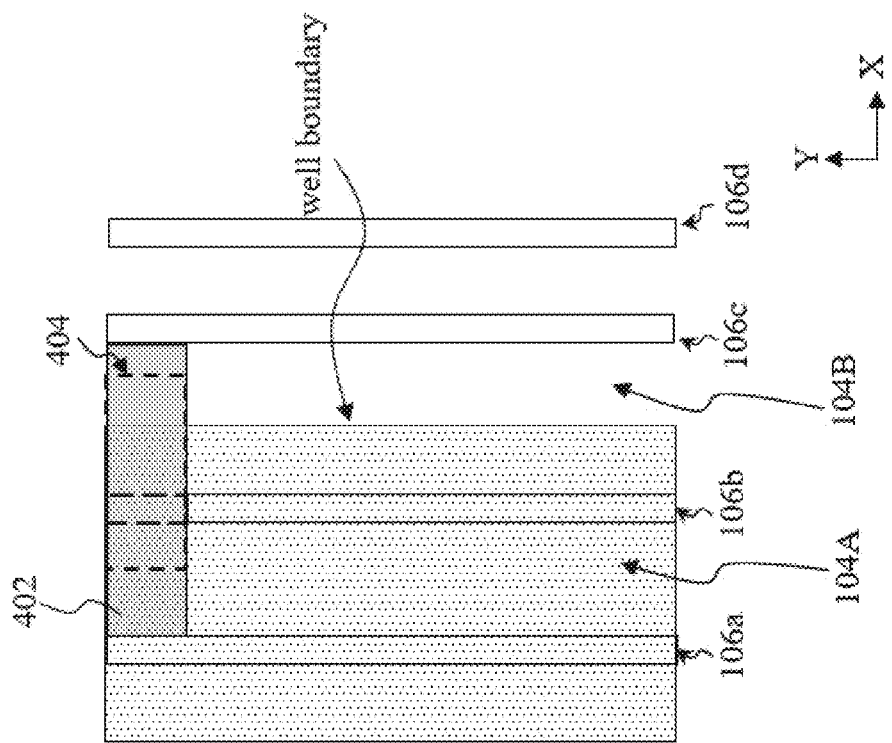
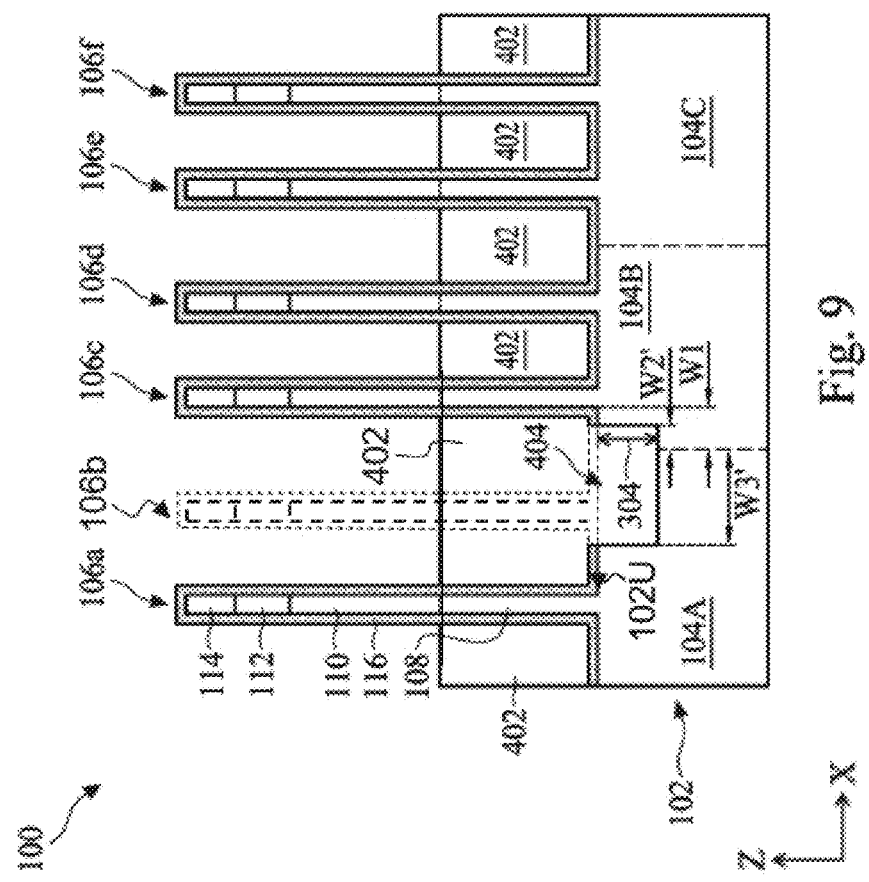
Fig. 9a
Fig. 9

FinFET CIRCUIT DEVICES WITH WELL ISOLATION

PRIORITY

The present application is a continuation application of U.S. patent application Ser. No. 17/682,425, filed Feb. 28, 2022, which is a divisional application of U.S. patent application Ser. No. 16/450,278, filed Jun. 24, 2019 and issued as U.S. patent Ser. No. 11/264,268, which claims the benefits of U.S. Provisional Application No. 62/772,658, filed Nov. 29, 2018, each of which is incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, advances in fabrication have enabled three-dimensional designs, such as Fin-like Field Effect Transistors (FinFETs). FinFETs provide reduced short channel effects, reduced leakage, and higher current flow, compared to planner FETs. Due to these advantages, FinFETs have been utilized for further scaling down ICs. However, certain areas of existing FinFET fabrication can be further improved. For example, in FinFET CMOS designs, latch-up may occur due to leakage between adjacent N-well and P-well.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4, 5, 6, 7, 8, 9, 10 and 11 are cross-sectional illustrations of a workpiece according to various aspects of the present disclosure where the cross-sectional view is taken along the A-A line in FIG. 3, FIG. 9a depicts a fragmentary top view of the workpiece shown in FIG. 9.

DETAILED DESCRIPTION

Figure 1:
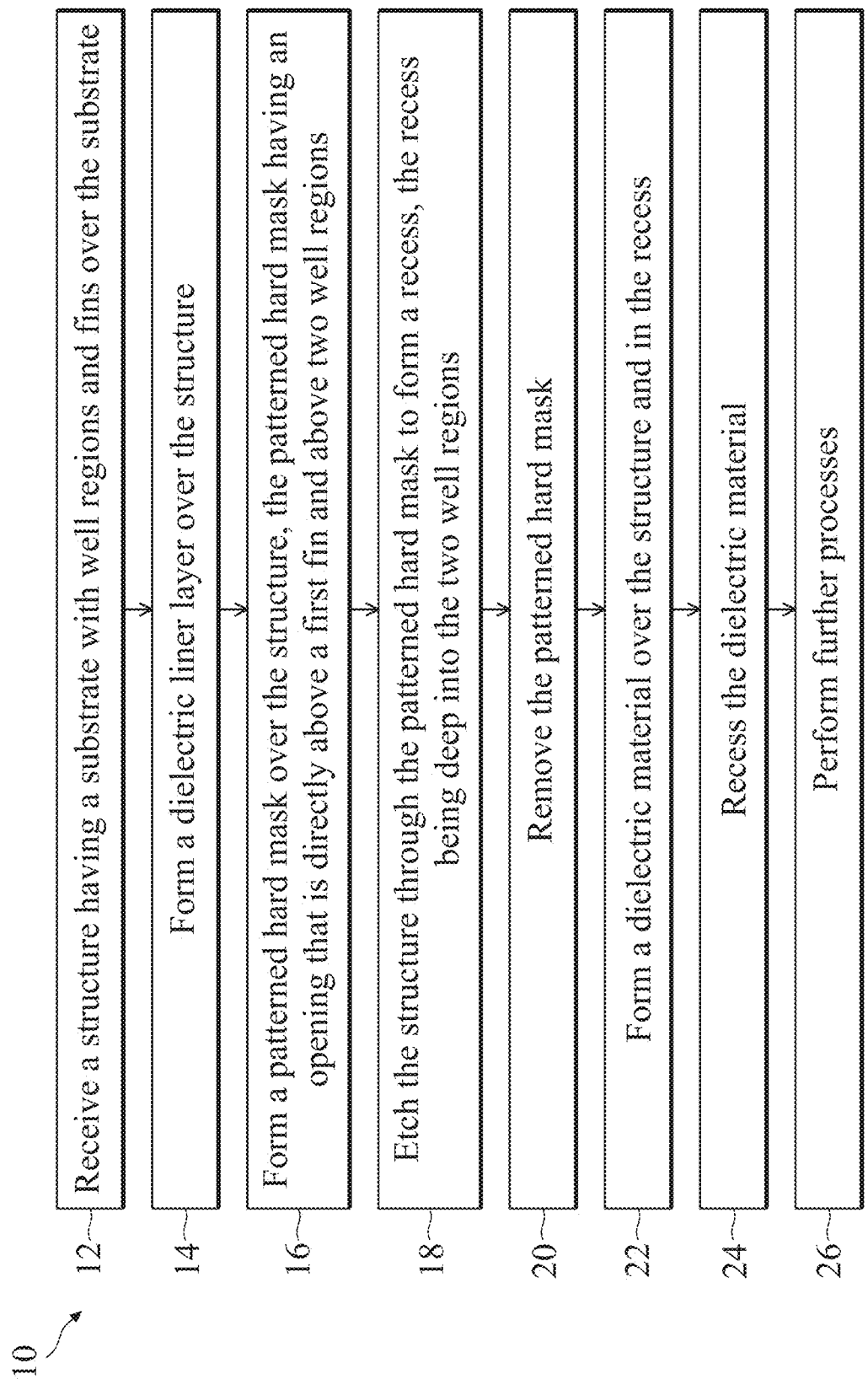
FIG. 1 is a flow chart of a method according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted. Still further, when a number or a range of numbers is described with "about," "approximately," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 12:
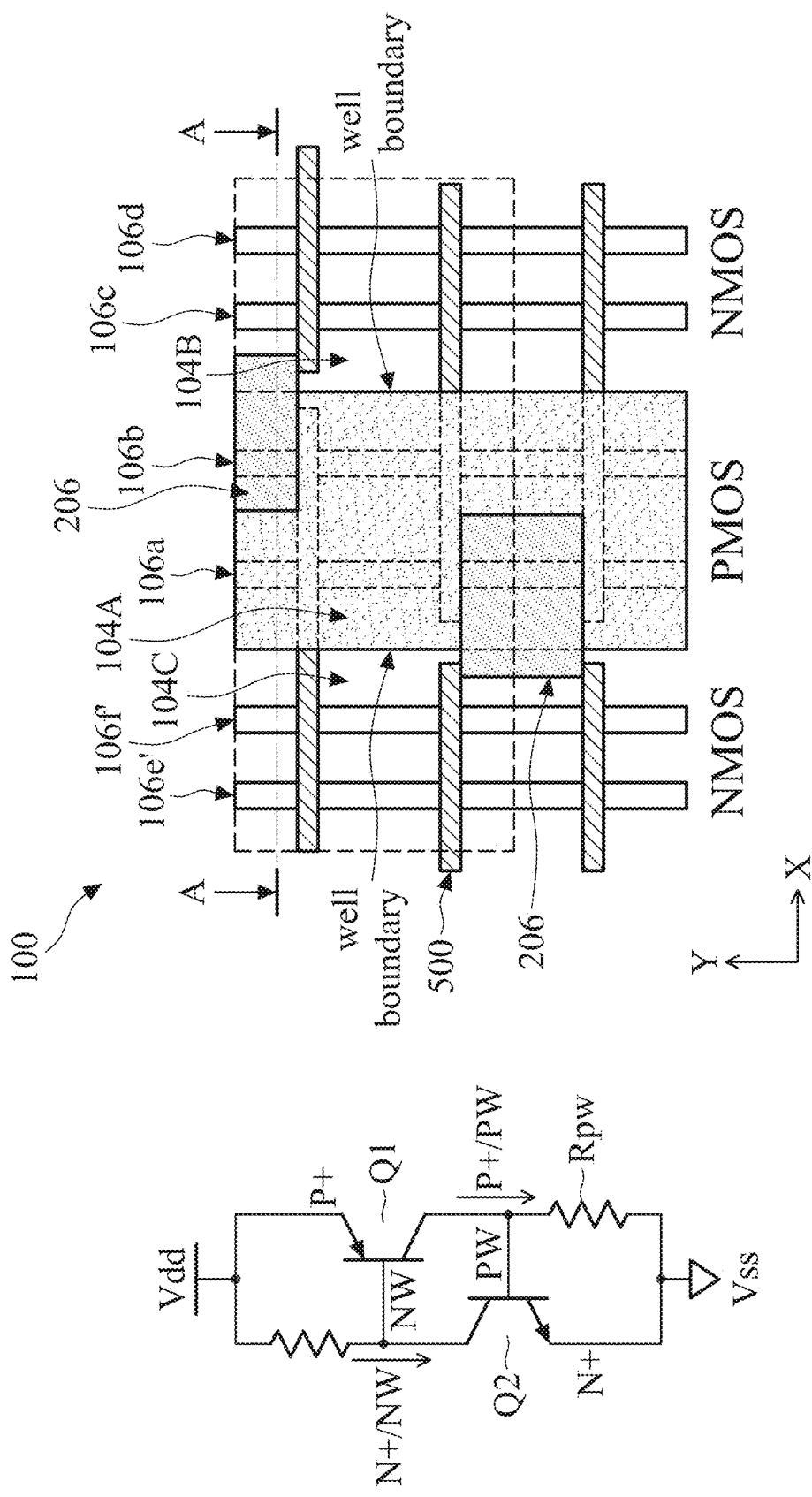
FIG. 12 illustrates a schematic diagram and a layout diagram of an IC according to various aspects of the present disclosure.

As the devices continue to scale down, leakage current between oppositely doped well regions on an IC becomes a concern because it may trigger latch-up in the circuit. This is of particular concern for today's SRAM designs where NMOS and PMOS transistors (including NMOS FinFET and PMOS FinFET) are closely placed. FIG. 12 explains an example of latch-up. FIG. 12 illustrates, on the right, a layout diagram of a semiconductor device 100 including a 1-bit SRAM cell having CMOS circuits, and on the left, a circuit diagram representing intrinsic bipolar transistors of a CMOS circuit of the 1-bit SRAM cell. When one of the two bipolar transistors become forward biased (due to leakage current flowing through the well or substrate, as illustrated as "N+/NW→" and "P+/PW→"), it feeds the base of the other transistor. This positive feedback increases the current until the circuit fails or burns out. This is referred to as "latch-up." An object of the present disclosure is to prevent latch-up by providing well isolation features that separate well regions of different dopant types. For example, the well isolation feature may be provided between an N-type doped well region and a P-type doped well region in order to substantially reduce leakage current between the two well regions.

Some embodiments of the present disclosure are described with reference to FIGS. 1-12. FIG. 1 is a flow chart of a method 10 of fabricating a semiconductor device to have the well isolation feature according to the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-11, which illustrate various perspective and cross-sectional views of the semiconductor device 100 during fabrication steps according to the method 10. Further, FIG. 12 illustrates an example IC schematic and layout diagrams that are fabricated according to the present disclosure.

Referring to FIG. 1, at operation 12, the method 10 receives a structure (or a workpiece) 100 having a substrate with well regions and semiconductor fins extending from the substrate. An example of the structure 100 is shown in FIG. 2.

Figure 2:
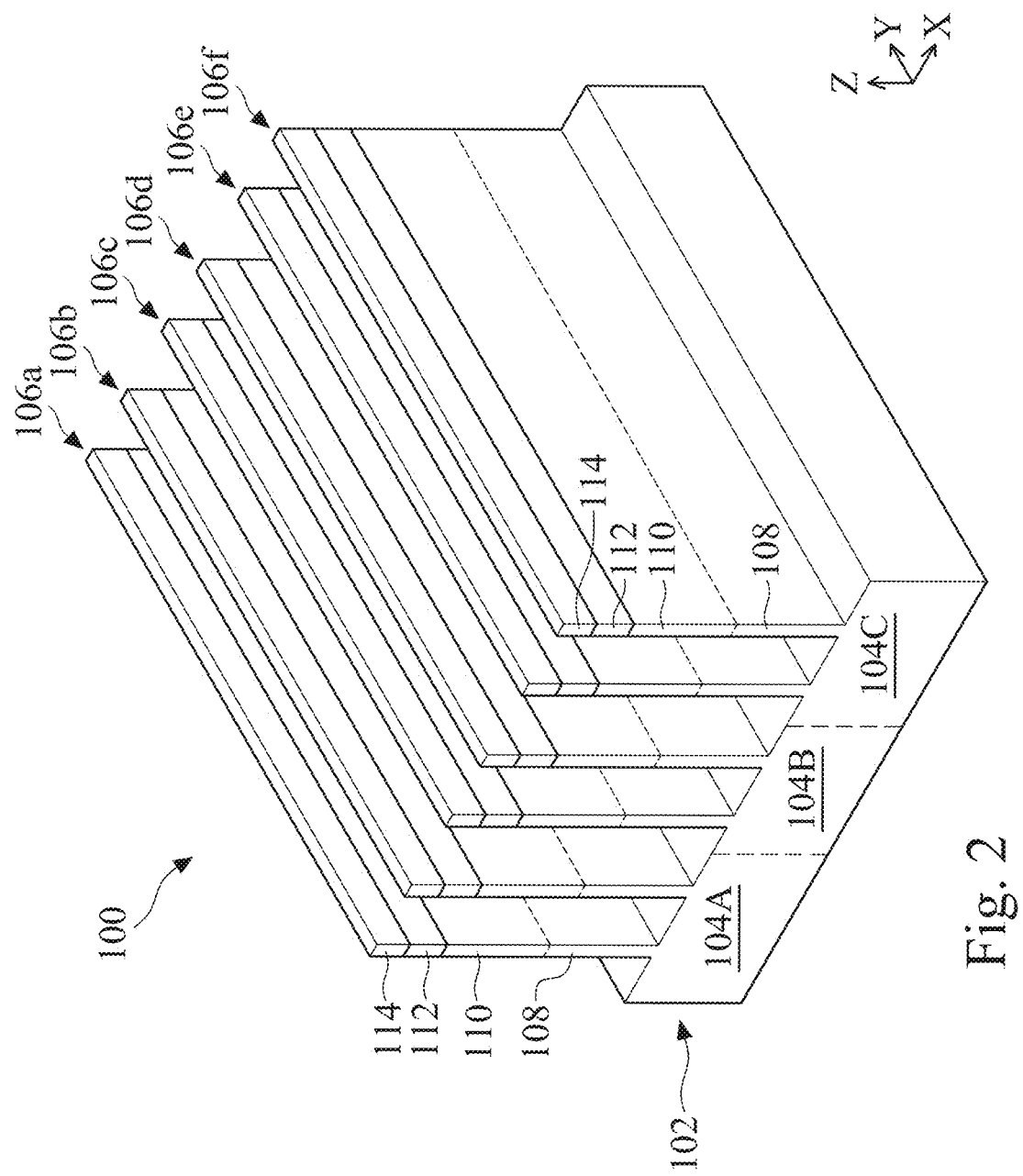
FIGS. 2-3 are a perspective illustration of a workpiece according to various aspects of the present disclosure.

Referring to FIG. 2, the structure 100 includes a substrate 102 that represents any structure upon which circuit devices may be formed. In various examples, the substrate 102 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 102 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 102 may include an insulator such as a semiconductor oxide, a semiconductor nitride, a semiconductor oxynitride, a semiconductor carbide, and/or other suitable insulator materials; and another layer of the substrate 102 includes semiconductor materials. In some examples, the substrate 102 is a bulk semiconductor substrate, such as a bulk silicon wafer.

Doped regions, such as wells, may be formed on the substrate 102. In that regard, some portions of the substrate 102 may be doped with p-type dopants, such as boron, $BF_2$, or indium while other portions of the substrate 102 may be doped with n-type dopants, such as phosphorus or arsenic; and/or other suitable dopants including combinations thereof. In the illustrated examples, well region 104A has a first dopant type (e.g., n-type), well region 104B has a second dopant type (e.g., p-type) that is opposite the first dopant type, and well region 104C has the first dopant type. Accordingly, pn junctions may be formed at the interfaces between these well regions 104. The inventor of this application has discovered that these pn junctions contribute to leakage currents and latch-up issues, particularly in SRAM designs where the geometries of the devices are really small. Again, the three well regions 104A-C are merely examples. In various embodiments, the structure 100 may include two or more oppositely doped well regions.

In some examples, the devices to be formed on the substrate 102 extend out of the substrate 102. For example, FinFETs and/or other non-planar devices may be formed on fin structures (or fins) 106 disposed on the substrate 102. The fins 106 are representative of any raised feature for forming FinFET devices as well as for forming other raised active and passive devices upon the substrate 102. The fins 106 may be similar in composition to the substrate 102 or may be different therefrom. For example, in some embodiments, the substrate 102 may include primarily silicon, while the fins 106 include one or more layers that are primarily germanium or a SiGe semiconductor. In some embodiments, the substrate 102 includes a SiGe semiconductor, and the fins 106 include a SiGe semiconductor with a different ratio of silicon to germanium than the substrate 102. In some embodiments, both the fins 106 and the substrate 102 include primarily silicon. FIG. 2 illustrates six fins 106*a*, 106*b*, 106*c*, 106*d*, 106*e*, and 106*f* as mere examples. The structure 100 may include any number of fins 106 in various embodiments. In the following discussion, the "fin 106" refers to any one of the fins 106*a-f* or another fin not shown in the figures, and the "fins 106" refers to any two or more of the fins 106*a-f* or other fins not shown in the figures. The fins 106 are oriented lengthwise along "Y" direction and spaced from each other along "X" direction. The well regions 104 are also oriented lengthwise along the "Y" direction.

Portions of the fins 106 may be doped differently from the portions of the substrate 102 that they extend from. In some examples, each fin 106 has a bottom portion 108 (also referred to as semiconductor region 108) that contains the same dopant type as the well region 104 from which it extends and a top portion 110 (also referred to as semiconductor region 110) that contains the opposite dopant type. In a specific example, the well regions 104A and 104C are n-type doped (i.e., an N-well), the semiconductor regions 108 of the fins 106*a*, 106*b*, 106*c*, and 106*f* are also n-type doped, and the semiconductor regions 110 of the fins 106*a*, 106*b*, 106*e*, and 106*f* are p-type doped; the well region 104B is p-type doped (i.e., an P-well), the semiconductor regions 108 of the fins 106*c* and 106*d* are also p-type doped, and the semiconductor regions 110 of the fins 106*c* and 106*d* are n-type doped.

The fins 106 may be formed by etching portions of the substrate 102, by depositing various layers on the substrate 102 and etching the layers, and/or by other suitable techniques. For example, the fins 106 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and one or more hard mask layers (i.e. the layers that fin-top hard mask patterns 112 and 114 are formed from). The sacrificial layer is patterned using a photolithography process. Spacers are formed alongside the patterned sacrificial layer using a self-aligned process. The sacrificial layer is then removed, and the remaining spacers are used to pattern the substrate 102 and the hard mask layers by removing materials that is not covered by the spacers. The remaining materials become the fins 106 including the fin-top hard mask patterns 112 and 114 in the present embodiment.

The fin-top hard mask patterns 112 and 114 may be used to control the etching process that defines the fins 106 and may protect the fins 106 during subsequent processing. Accordingly, the fin-top hard mask patterns 112 and 114 may be selected to have different etch selectivity from the material(s) of other portions of the fins 106 and from each other. The fin-top hard mask patterns 112 and 114 may include a dielectric material such as a semiconductor oxide, a semiconductor nitride, a semiconductor oxynitride, a semiconductor carbide, a semiconductor carbonitride, a semiconductor oxycarbonitride, and/or a metal oxide.

In some examples, the fins 106 are arranged in a repeating pattern to case the patterning process, and those fins 106 that are not part of the final circuit design may be subsequently removed, as will be discussed later.

Figure 3:
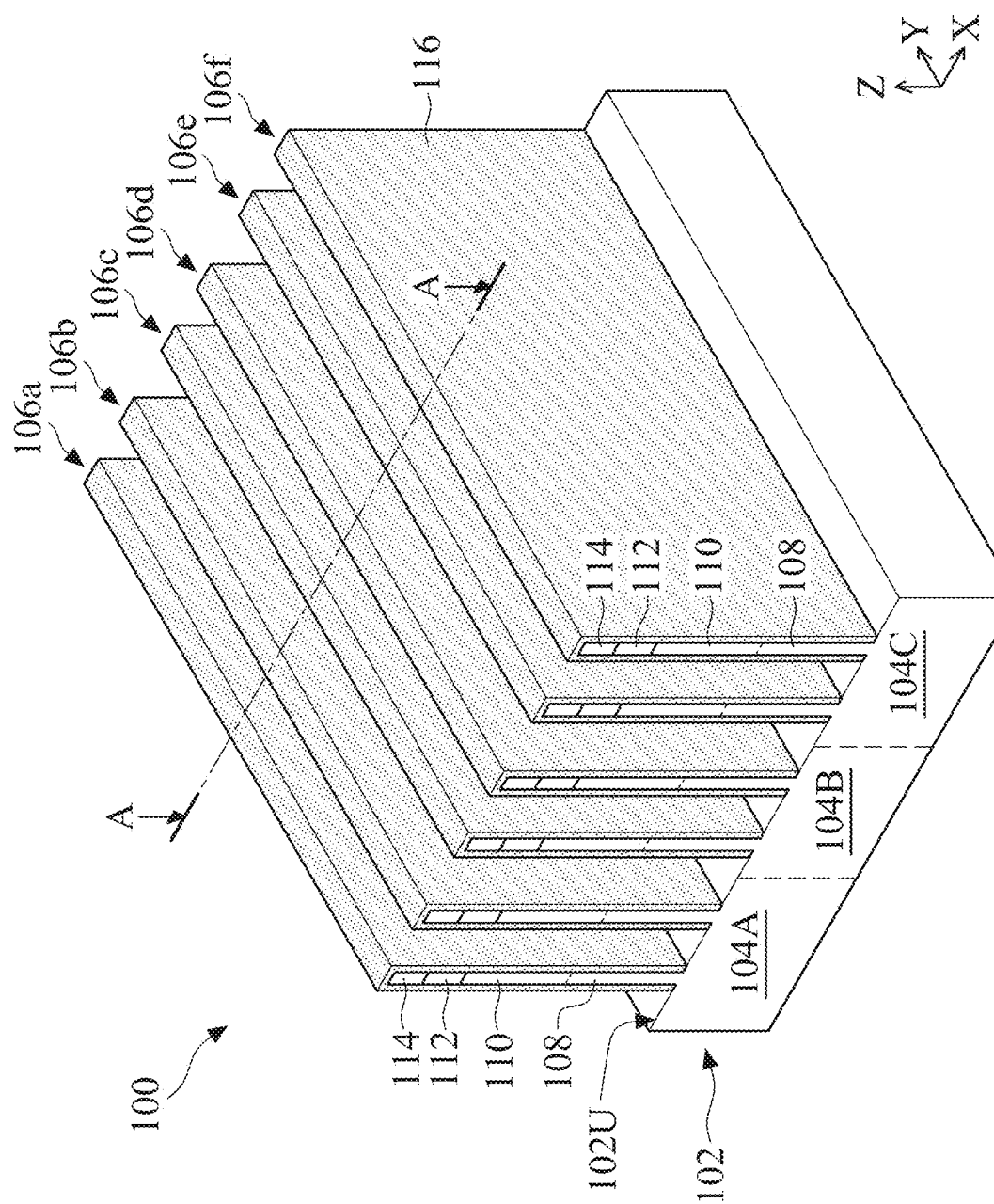

Referring to FIG. 1, at operation 14, the method 10 forms a dielectric liner layer 116 over the structure. Referring to FIG. 3, the dielectric liner layer 116 is formed over an upper surface 102U of the substrate 102 and on top and sidewalls of the fins 106. In the present embodiment, the dielectric liner layer 116 is formed in a substantially conformal manner (i.e., its thickness is substantially uniform). The dielectric liner layer 116 may include silicon nitride (e.g., $Si_3N_4$), and may be deposited using chemical vapor deposition (CVD) such as low-pressure CVD (LPCVD) or plasma-enhanced CVD (PECVD), atomic layer deposition (ALD), or other suitable methods. The dielectric liner layer 116 may have a thickness of about 1 nm to about 5 nm in various embodiments. The operation 14 is optional and may be omitted in some embodiments.

Operations 16, 18, and 20 of FIG. 1 describe the process of removing some of the fins 106. In a brief overview, operation 16 forms a patterned hard mask over the structure 100, wherein the patterned hard mask having an opening that is directly above one of the fins 106 and above two well regions 104; operation 18 etches the structure 100 through the opening in the patterned hard mask to form a recess that extends into the substrate 102; and operation 20 removes the patterned hard mask. The operations 16, 18, and 20 are further described below.

Figure 4:
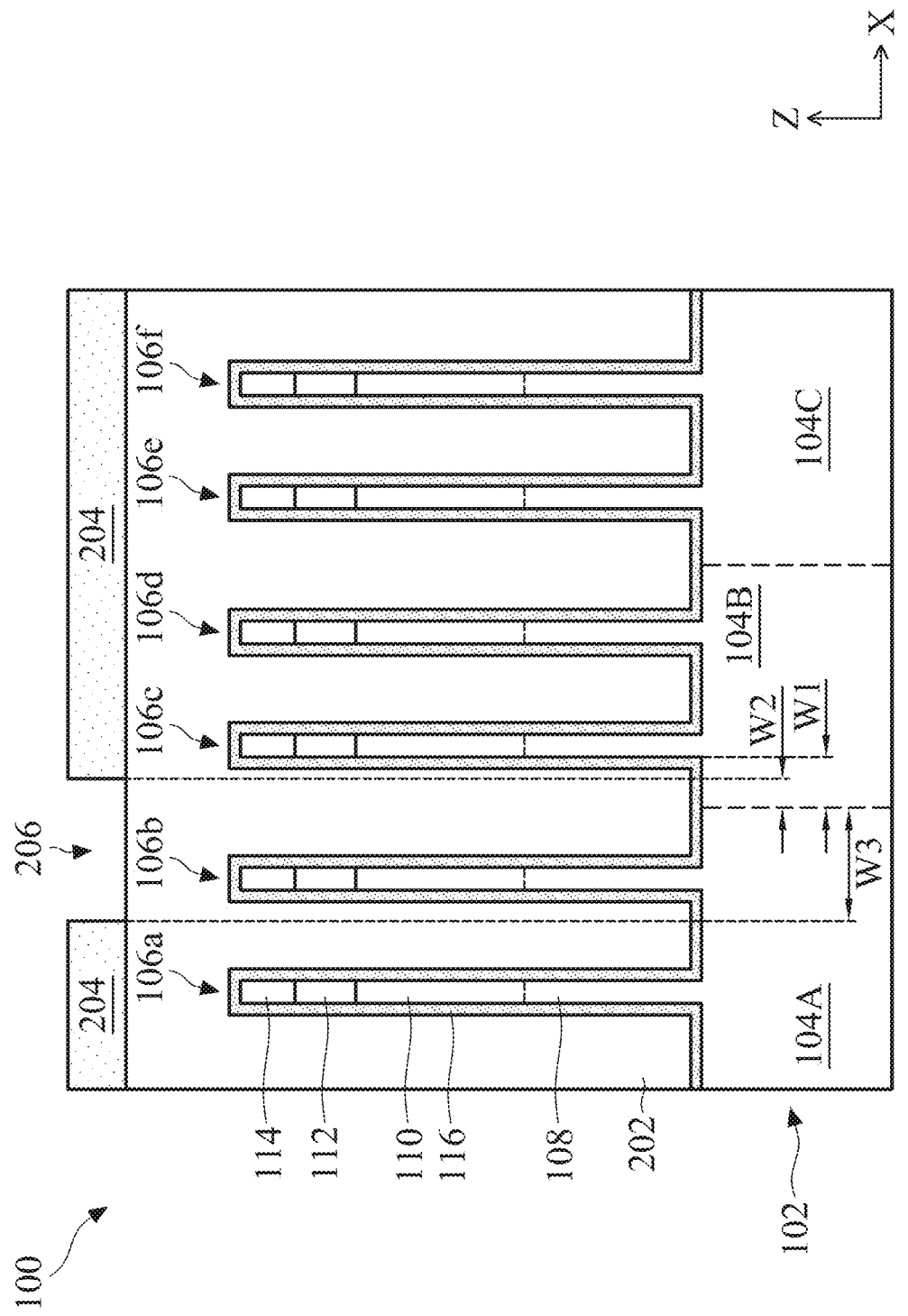

Referring to FIG. 1, at operation 16, the method 10 forms a patterned hard mask over the structure 100 and the patterned hard mask provides openings 206 directly above portions of the fins 106 to be removed, as shown in FIG. 4. In the present embodiment, operation 16 involves multiple process steps including depositing a hard mask layer (or a fill layer) 202 over the substrate 102 and filling the gaps between the fins 106, spin coating a photoresist layer 204 over the hard mask layer 202, and performing a photolithography process to pattern the photoresist layer 204 to form the openings 206. The patterned hard mask may be formed using other methods as well.

Referring to FIG. 4, the hard mask layer 202 surrounds the fins 106 and may be disposed on top of the fin-top hard masks 112 and 114. Suitable materials for the hard mask layer 202 include dielectrics, polysilicon, and/or other suitable materials, and the material of the hard mask layer 202 may be selected to have an etchant sensitivity that is different from that of the substrate 102 and the fins 106 including the fin-top hard masks 112 and 114. In some examples, the hard mask layer 202 includes a spin-on dielectric material. The hard mask layer 202 may be formed by any suitable process including Chemical Vapor Deposition (CVD), Plasma Enhanced CVD (PECVD), High-Density Plasma CVD (HDP-CVD), Atomic Layer Deposition (ALD), Plasma Enhanced ALD (PEALD), flowable CVD (FCVD), spin-on, and/or other suitable deposition techniques.

A photoresist layer 204 is formed on the hard mask layer 202, e.g., by spin coating, and is patterned to provide openings 206 therein. The photoresist layer 204 may be patterned using any suitable photolithography process such as immersion lithography, e-beam lithography, and EUV lithography. In an embodiment, a photolithographic system exposes the photoresist 204 to radiation in a particular pattern determined by a mask. Light passing through or reflecting off the mask strikes the photoresist 204 thereby transferring a pattern formed on the mask to the photoresist 204. In another embodiment, the photoresist 204 is exposed using a direct write or maskless lithographic technique, such as laser patterning, e-beam patterning, and/or ion-beam patterning. Once exposed, the photoresist 204 is developed, leaving the exposed portions of the resist, or in alternative examples, leaving the unexposed portions of the resist. An exemplary patterning process includes soft baking of the photoresist 204, mask aligning, exposure, post-exposure baking, developing the photoresist 204, rinsing, and drying (e.g., hard baking). The patterned photoresist 204 exposes portions of the hard mask layer 202 to be etched through the openings 206.

In the present embodiment, the openings 206 (one shown in FIG. 4) are directly above portions of the fins 106 to be removed (which is a portion of the fin 106b in this example). To form well isolation features according to the present embodiment, the opening 206 is wide enough to extend over an interface (or boundary) between two well regions having opposite dopant types (such as well region 104A and well region 104B). In the example shown in FIG. 4, a distance from the boundary of the well regions 104A and 104B to the sidewall of the fin 106c (being the closest fin to the well region 104A among the fins on the well region 104B) along the X direction (the fin width direction) is W1, the opening 206 extends a distance W2 from the boundary of the well regions 104A and 104B towards the fin 106c along the X direction, and W2 is less than W1. In some embodiments, the distance W2 is controlled to be about half of W1, such as 40% to 60% of W1. This is to account for process variation and still provide sufficient isolation effects between the well regions 104A and 104B (as will be described later with reference to the well isolation feature 404 in FIGS. 8-11). If the distance W2 is too large (i.e., the edge of the opening 206 is very close to the fin 106c), the subsequent etching processes may damage the fin 106c. If the distance W2 is too small (i.e., the edge of the opening 206 is very close to the boundary of the well regions 104A and 104B or the opening 206 does not even reach the well region 104B), the isolation effects of the isolation feature 404 will be lost. In addition, the opening 206 is directly above the fin 106b with sufficient margin on both sides thereof to ensure the portion of the fin 106b is fully removed. In the present embodiment, the opening 206 extends a distance W3 from the boundary of the well regions 104A and 104B towards and past the fin 106b (being the closest fin to the well region 104A among the fins on the well region 104B) along the X direction, and W3 is greater than W2. Even though one opening 206 is illustrated in FIG. 4, operation 16 may form any number of openings 206 based on circuit design. In the example shown in FIG. 12, two openings 206 are provided for removing portions of the fins 106a and 106b.

Figure 5:
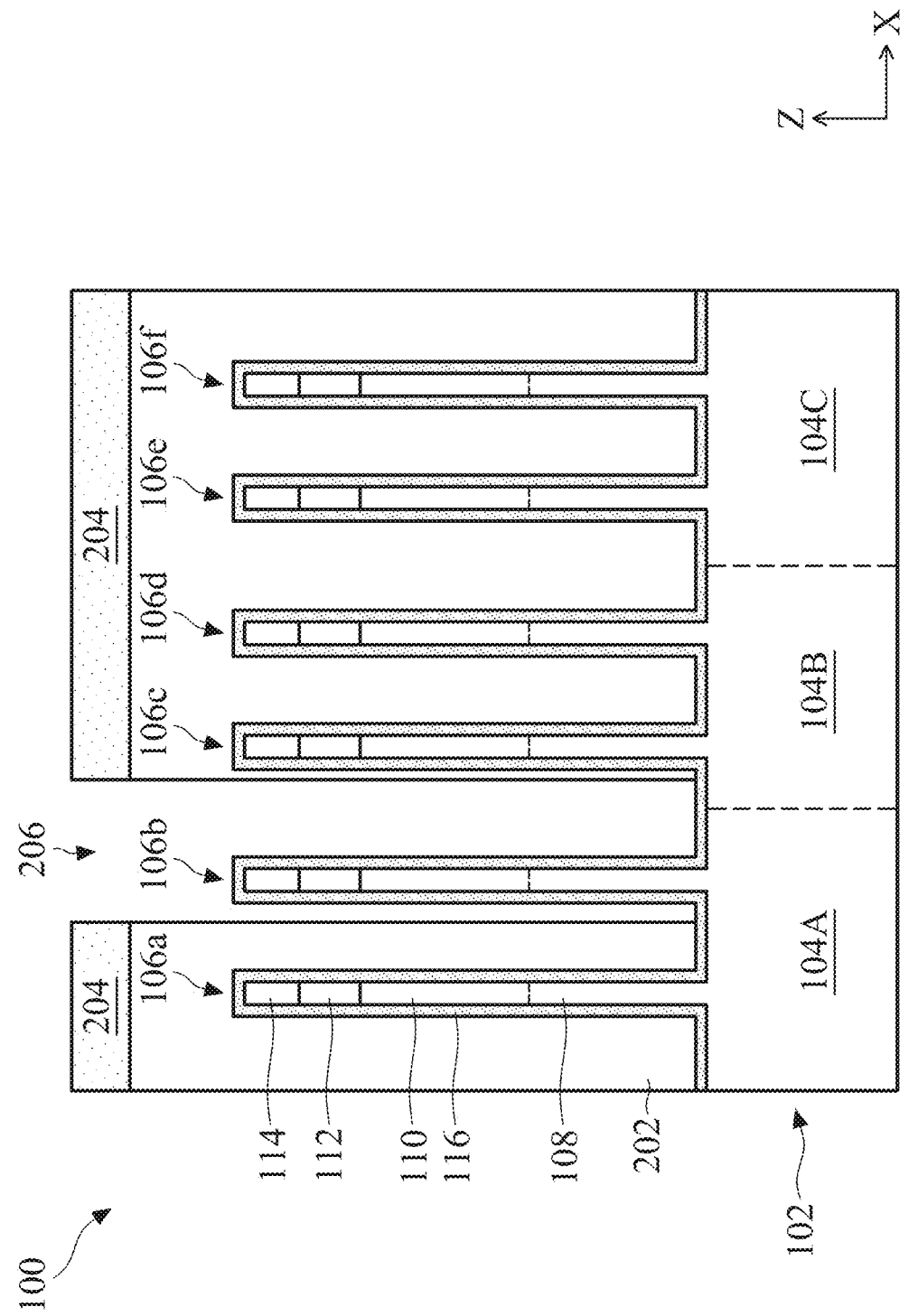

Referring to FIG. 1, at operation 18, the method 10 performs one or more etching processes to remove the exposed portions of the hard mask layer 202 and the underlying fins 106 including fin-top hard masks 112 and 114, if any. In some examples, this includes a first etching process to remove the exposed portion of the hard mask layer 202 followed by a second etching process performed on the portions of the fins 106. The first etching processes may include any suitable etching technique such as wet etching, dry etching, reactive ion etching (RIE), ashing, and/or other etching techniques. In some examples, the etchant is selected to etch the hard mask layer 202 without significantly etching the substrate 102 and the fins 106. As a result, a portion of the fin 106b becomes exposed in the opening 206, such as shown in FIG. 5. A remaining portion of the fin 106b not exposed in the opening 206 is represented by dashed lines shown in FIG. 9. If the structure includes the optional liner layer 116, then a portion of the liner layer 116 on top and sidewalls of the fin 106b and on the upper surface of the substrate 102 becomes exposed in the opening 206, such as shown in FIG. 5. After etching the hard mask layer 202, the photoresist 204 may be removed.

Subsequently, the second etching process is performed on the portions of the fins 106 (which may be covered by the optional liner layer 116) within the opening 206. In some embodiments, the second etching process includes an RIE etching process where fluorine ions and/or other ion species are directed towards the optional liner layer 116, the fin-top hard masks 112 and 114, and the semiconductor regions 108 and 110 to be etched. The ions may remove material from these features from the force of the impact (sputter etching) and/or react with the materials of the features to create a compound sensitive to a subsequent wet or dry etchant. In an embodiment, the second etching process uses a fluorine-containing etchant that includes one or more of $CF_2$, $CH_2F_2$, $F_2$, $SF_6$, and $CH_3F$. Example etching conditions include an etching power about 300 W to 600 W and an etching bias voltage about 400V to 600V. Additionally or in the alternative, the etching process may include wet etching, dry etching, other RIE process, and/or other suitable etching techniques using an oxygen-based etchant, a fluorine-based etchant, a chlorine-based etchant, a bromine-based etchant, an iodine-based etchant, other suitable etchant gases or plasmas, and/or combinations thereof.

Figure 6:
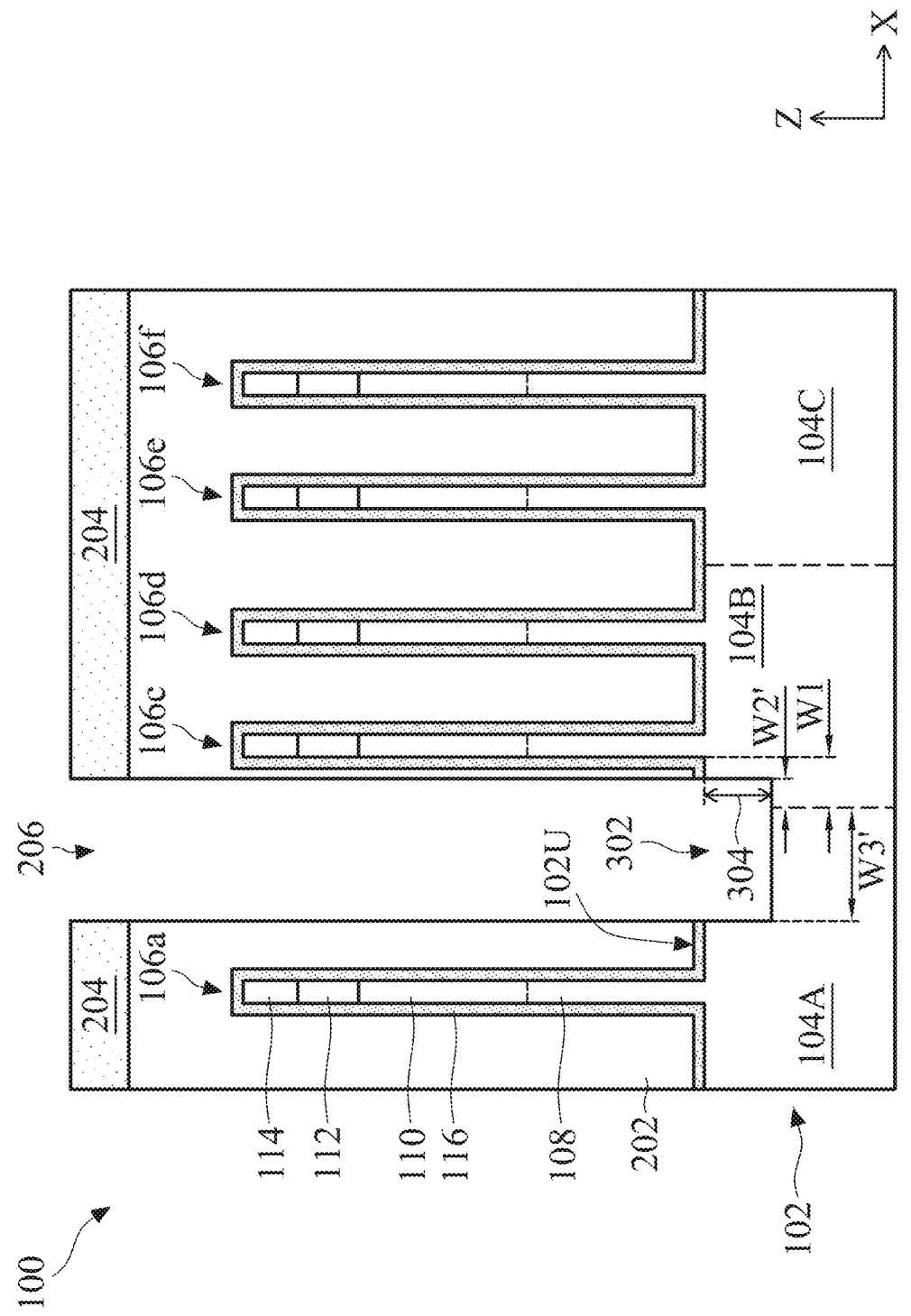

In addition to removing the portion of the fins 106 (e.g., 106b), the etching also cuts into the substrate 102 and creates recesses 302 therein (this is referred to as "heavier etch" in some instances because it etches deeper than merely removing the fins), such as shown in FIG. 6 where one recess 302 is illustrated. The recesses 302 are subsequently filled with dielectric material(s) to create well isolation features (such as features 404 in FIGS. 9, 9a, 10, and 11) that reduce the flow of leakage current between the well regions (such as well regions 104A and 104B). This provides a number of advantages. For example, reducing leakage current by itself may be beneficial as reduced leakage improves efficiency and reduces heat. As another example, the well isolation features 404 may prevent latch-up, where one conducting transistor causes another transistor to conduct regardless of the gate voltage. As device spacing shrinks, latch-up may become more common. However, by reducing the flow of current between the well regions, the well isolation features 404 allow for closer device spacing with reduced incidences of latch-up.

The recess 302 spans across the boundary of the well regions 104A and 104B, as shown in FIG. 6, the recess 302 extends into the well region 104B with a distance W2' from the boundary of the well regions 104A and 104B, and extends into the well region 104A with a distance W3' from the boundary of the well regions 104A and 104B. In the present embodiment, W3' is greater than W2'. Further, W2' is about 40% to 60% of W1. The dimensions W2' and W3' are substantially the same as the dimensions W2 and W3, respectively, taking into account any differences caused by the etching processes.

The recesses 302 may be etched to any suitable depth 304, and in examples where the fins 106 extend between about 100 nm and about 500 nm above the top surface 102U of the substrate 102, the recess 302 may extend at least 25 nm below the top surface 102U of the substrate 102 that are between the fins 106a and 106c and immediately adjacent the recess 302. In some embodiments, the depth 304 is between about 25 nm and about 75 nm below the top surface 102U of the substrate 102. The depth 304 is designed such that the relatively more heavily doped portion of the well regions 104A and 104B is removed from the recesses to substantially reduce the leakage currents through the well regions. As observed from real samples and from simulation data, the dopants in the well regions 104 (such as 104A and 104B) tend to concentrate at the upper portion of the well regions, for example, within the upper 25 nm to 75 nm thickness from the top surface of the substrate 102. By removing this portion of the well region and replacing it with a dielectric material (shown as feature 404 in FIGS. 8-11), the leakage currents through the well regions are greatly reduced. The portion of the well regions 104 beneath the recess 302 is more lightly doped than the removed portion and has relatively high electrical resistance. Thus, it does not cause any meaningful leakage currents. In an embodiment, the recess 302 extends at least 40 nm below the top surface of the substrate 102 (i.e., the depth 304 is 40 nm or more) to ensure that the more heavily doped portion of the well regions 104A and 104B is removed. In various embodiments, the substrate 102 is at least a few hundred nanometers or a few micrometers thick.

In various embodiments, the operation 18 may use a timer and/or other methods to control the etching depth 304. For example, the operation 18 may monitor the etching residue to determine when the second etching process has begun to etch the well region 104, and then control the etching depth 304 based on the etching time and the etching rate. The etching rate is affected by the type, density, and/or flow rate of the etchant(s), etching power, etching bias, material of the well region 104, as well as other factors. The etching rate can be determined from experiments and/or past process data. In some embodiments, the first and the second etching processes described above may be performed continuously or as one etching process (e.g., performed in the same etching chamber).

Figure 11:
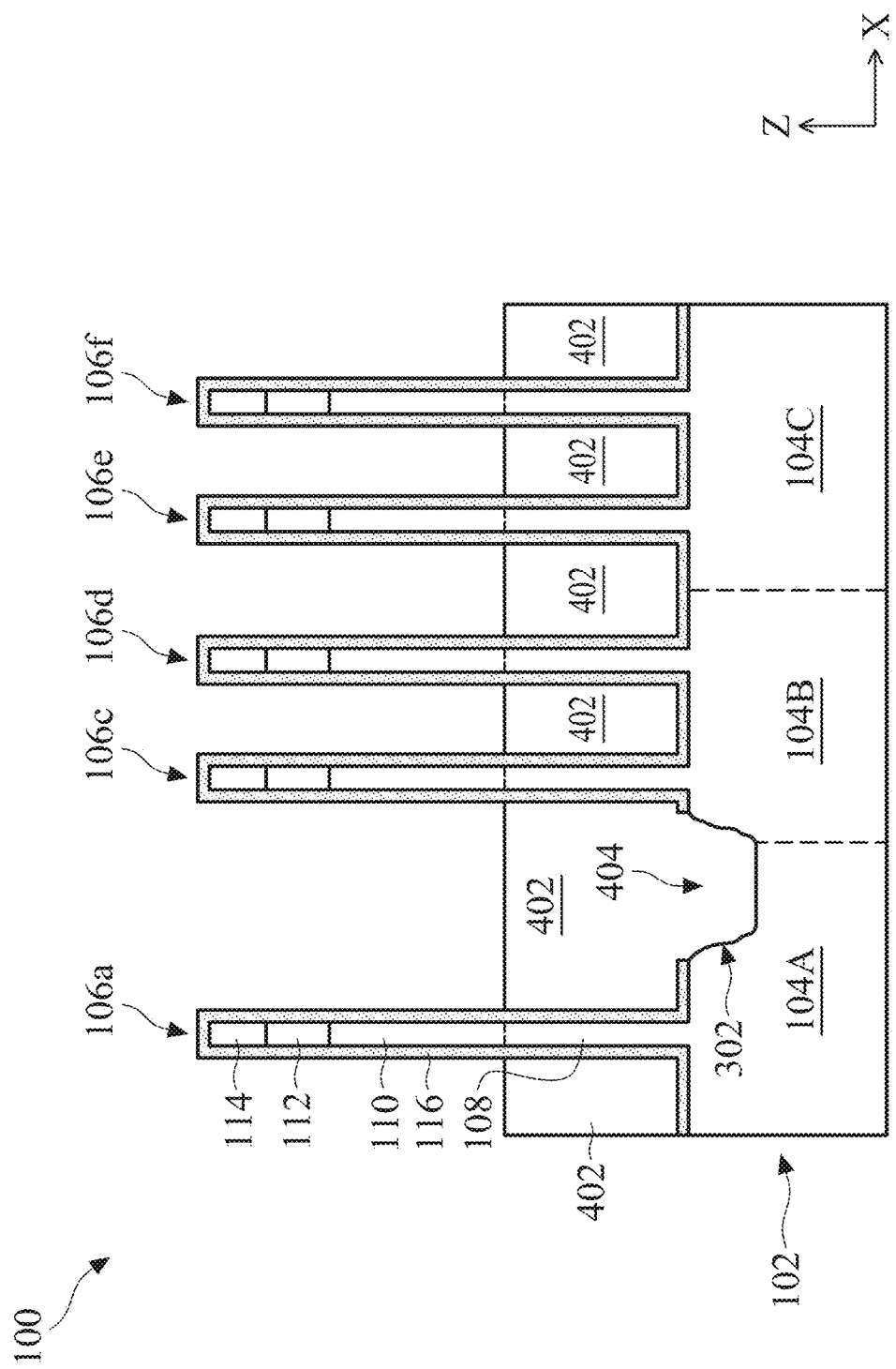

The recesses 302 may be etched to have different profiles. In the example shown in FIG. 6, the recess 302 has a substantially rectangular profile. This may result from a highly directional etching process. In another example, the recess 302 may be etched to have a tapered profile, such as having a top opening wider than the bottom opening. Such example is illustrated in FIG. 11 where the tapered contour of the well isolation feature 404 represents the profile of the recess 302. In this example, the recess 302 (as well as the well isolation feature 404) has rounded corners (rounded top corners and/or rounded bottom corners) which result from the etching process. Also, in this example, the recess 302 has its top opening wider than its bottom opening. Having a tapered profile in the recess 302 makes it easier to fill with the dielectric material without any voids, thereby increasing the reliability of the circuit.

Figure 7:
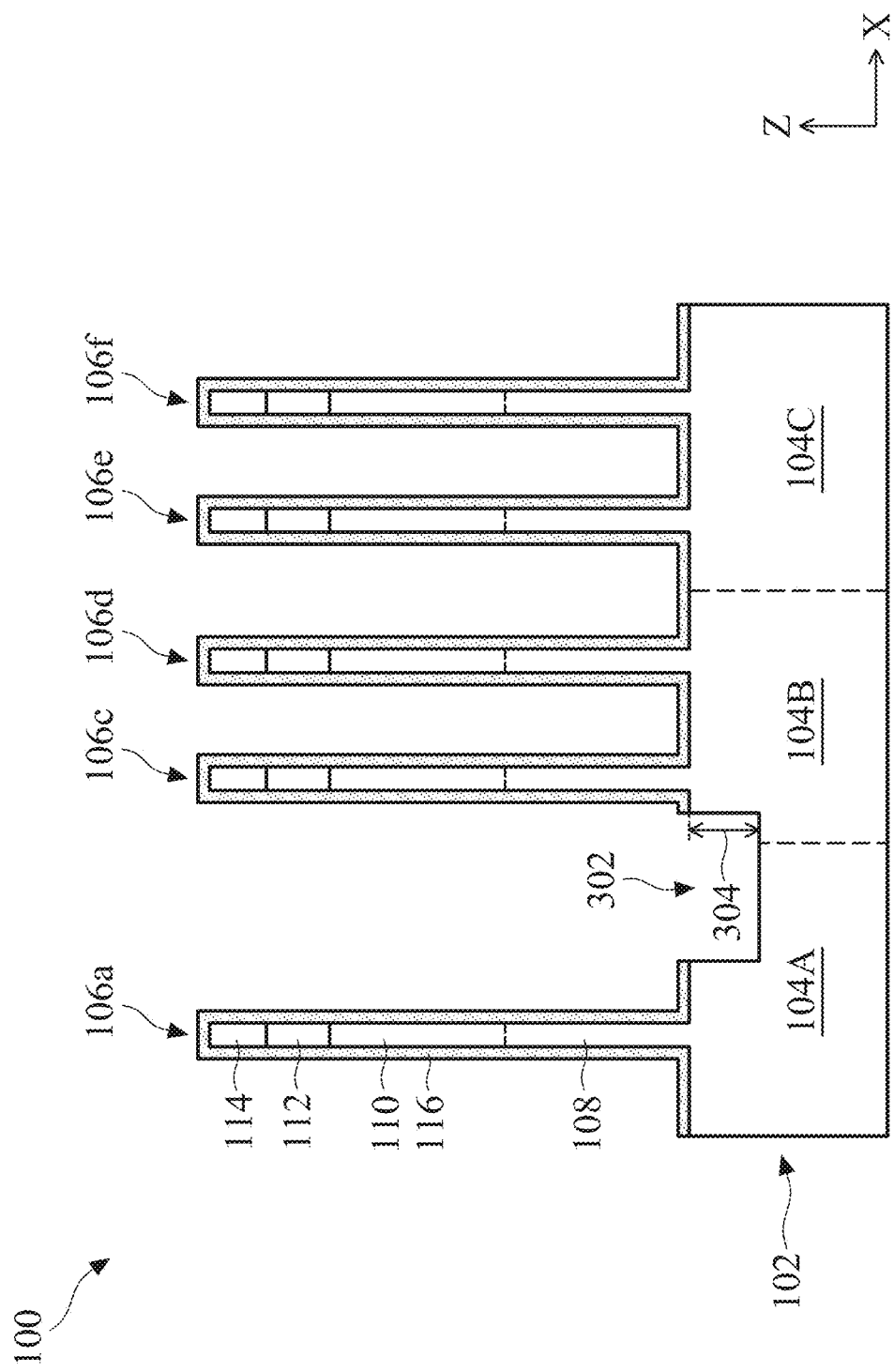

Referring to FIG. 1, at operation 20, the method 10 removes the hard mask layer 202, following the etching of the fins 106 and the well regions 104. The operation 20 may use any suitable etching technique (such as wet etching, dry etching, and RIE) selective to the material(s) in the hard mask layer 202. The resultant structure 100 is shown in FIG. 7, which is substantially the same as the structure 100 shown in FIG. 3 but with portions of the fins 106 and the well regions 104 removed.

Figure 8:
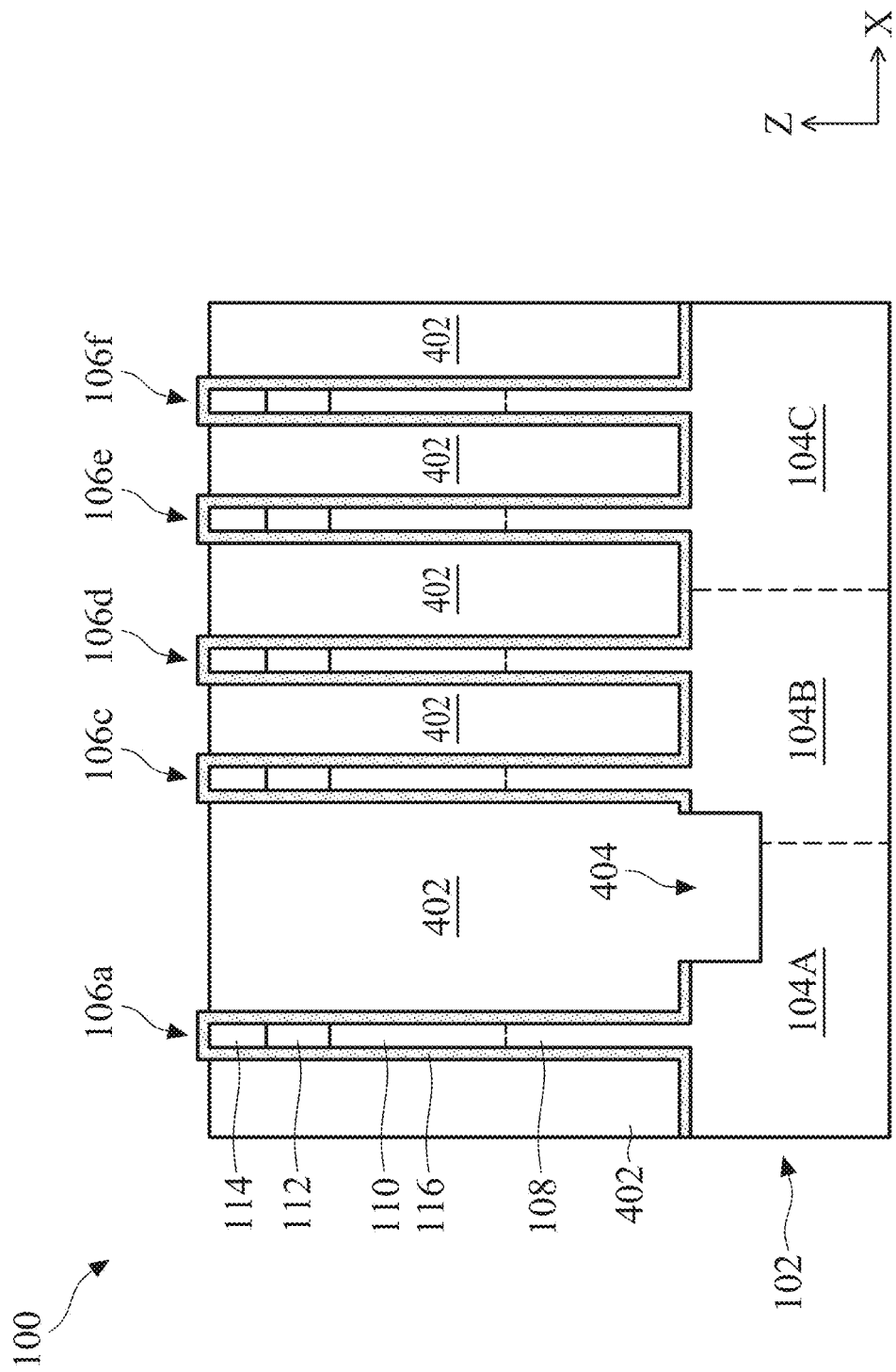

Referring to FIG. 1, at operation 22, the method 10 forms isolation features 402 over the structure 100, particularly filling the recesses 302. Referring to FIG. 8, isolation features 402, such as Shallow Trench Isolation features (STIs), are formed on the structure 100 by depositing one or more dielectric materials such as semiconductor oxides, semiconductor nitrides, semiconductor carbides, fluorosilicate glass (FSG), low-K dielectric materials, and/or other suitable dielectric materials between the fins 106 including in the recesses 302. The portion of the isolation features 402 within the recess 302 becomes a well isolation feature 404. The material of the isolation features 402 may be formed by any suitable process including CVD, PECVD, HDP-CVD, ALD, PEALD, PVD, FCVD, spin-on, and/or other suitable deposition techniques. In some embodiment, the operation 22 may include a chemical mechanical polishing (CMP) process to planarize the top surface of the isolation features 402. The fin-top hard mask 114 may serve as the etch stop layer for the CMP process.

Referring to FIG. 1, at operation 24, the method 10 recesses (or etches back) the isolation features 402. In an embodiment, the isolation features 402 are recessed to a level that is even with the interface between the semiconductor region 110 and the semiconductor region 108, such as shown in FIG. 9. Referring to FIG. 9, the fins 106 extend above a top surface of the isolation features 402, and the well isolation feature 404 (which is a portion of the isolation features 402) extend into the substrate 102. A bottom surface of the well isolation feature 404 is below the top surface 102U of the substrate 102. Particularly, the well isolation feature 404 spans across the boundary between the well regions 104A and 104B. The well isolation feature 404 extends into the well region 104B with a distance W2' from the boundary of the well regions 104A and 104B, and extends into the well region 104A with a distance W3' from the boundary of the well regions 104A and 104B. In the present embodiment, W3' is greater than W2'. Further, W2' is about 40% to 60% of W1. The profile of the well isolation feature 404 substantially match that of the recess 302. When the recess 302 has a substantially rectangular profile (such as shown in FIG. 6), the well isolation feature 404 also has a substantially rectangular profile (such as shown in FIG. 9). When the recess 302 has a tapered profile, the well isolation feature 404 also has a tapered profile, such as shown in FIG. 11 where the top portion of the well isolation feature 404 is wider than the bottom portion of the well isolation feature 404. Also, the well isolation feature 404 may have rounded corners (rounded top corners and/or rounded bottom corners) in some embodiments.

Figure 10:
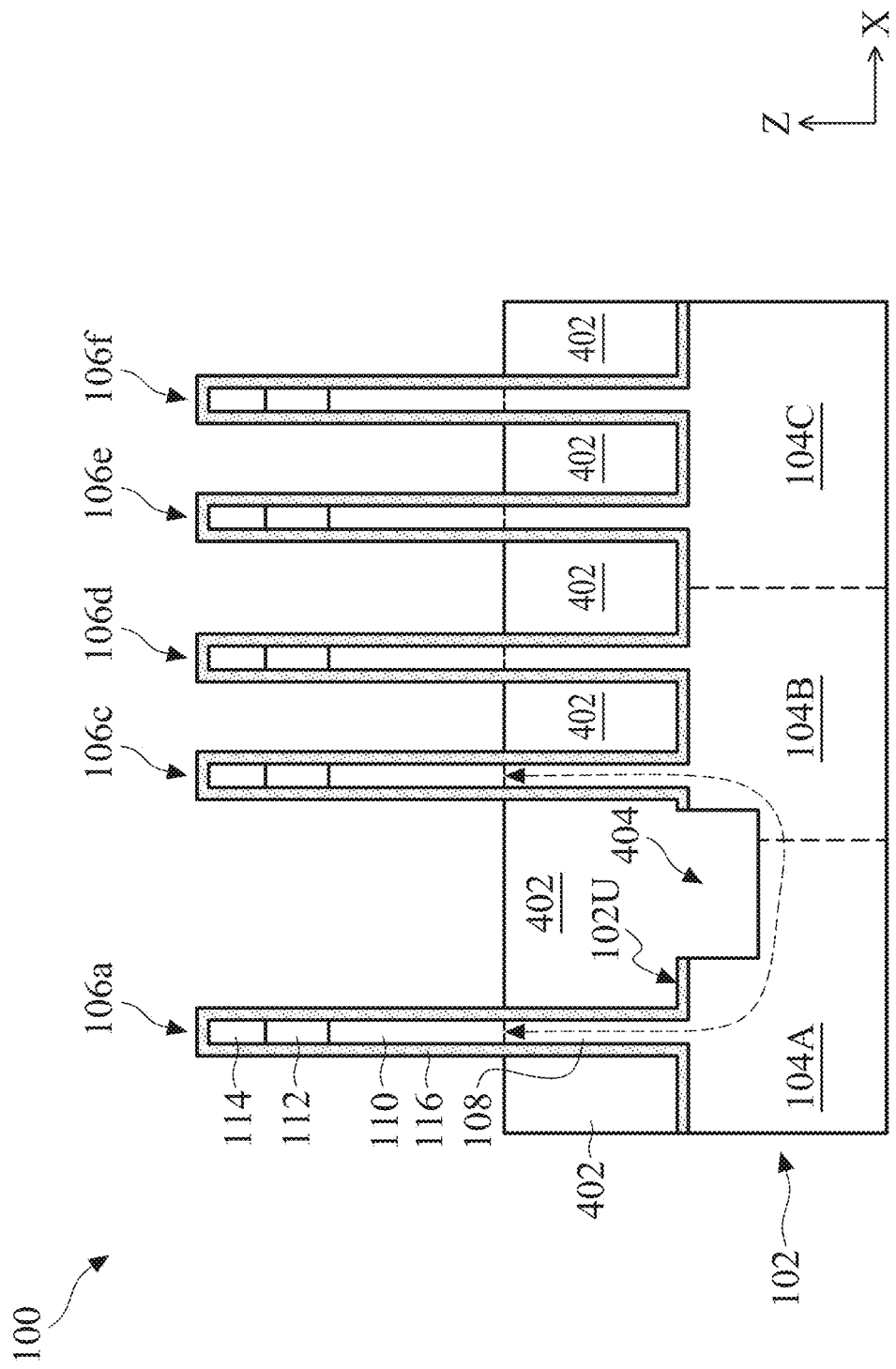

FIG. 10 illustrates some of the benefits of the well isolation features 404. Referring to FIG. 10, an example PNPN structure is illustrated with a dashed line between the fins 106a and 106c. More specifically, the semiconductor region 110 of the fin 106a is p-type doped, the semiconductor region 108 of the fin 106a and the well region 104A are n-type doped, the semiconductor region 108 of the fin 106c and the well region 104B are p-type doped, and the semiconductor region 110 of the fin 106c is n-type doped. This PNPN structure may trigger latch-up in the circuit if there is sufficient leakage between the well regions 104A and 104B (such as illustrated in the circuit diagram of FIG. 12). In the present embodiment, since a top portion of the well regions 104A and 104B is removed and is replaced with the well isolation feature 404, the leakage current between the well regions 104A and 104B is greatly reduced and the likelihood of this PNPN structure triggering latch-up is also greatly reduced. The inventors have observed up to 2 orders (i.e., 100 times) of reduction of the leakage current and up to 10% improvement in latch-up trigger voltage (i.e., the supply voltage at which latch-up occurs). In another embodiment, the dopant types in the regions 110, 108, and 104 may be reversed to create a NPNP structure. For example, the semiconductor region 110 of the fin 106a is n-type doped, the semiconductor region 108 of the fin 106a and the well region 104A are p-type doped, the semiconductor region 108 of the fin 106c and the well region 104B are n-type doped, and the semiconductor region 110 of the fin 106c is p-type doped. In this example, the well isolation feature 404 also reduces the likelihood of the NPNP structure triggering any latch-up in the circuit.

Referring to FIG. 1, at operation 26, the method 10 performs further processes to the structure 100. For example, the structure 100 may be processed to form active and passive devices thereupon. In some examples, a transistor (e.g., FinFET) is formed on a fin 106 by forming a pair of source/drain features separated by a channel region. The source/drain features may include a semiconductor (e.g., Si, Ge, SiGe, etc.) and one or more dopants, such as p-type dopants or n-type dopants. Similarly, the channel region may include a semiconductor and one or more dopants of the opposite type of those of the source/drain features or be simply undoped. In some examples, a gate stack is formed adjacent to and wrapping around the channel region to control the flow of charge carriers (electrons for an n-channel FinFET and holes for a p-channel FinFET) through the channel region. An Inter-Level Dielectric (ILD) layer may be formed on the structure 100. The ILD layer acts as an insulator that supports and isolates conductive traces of an electrical multi-level interconnect structure that electrically interconnects elements of the structure 100, such as the source/drain features and the gate stack. The ILD layer may comprise a dielectric material (e.g., a semiconductor oxide, a semiconductor nitride, a semiconductor oxynitride, a semiconductor carbide, etc.), Spin On Glass (SOG), FSG, phosphosilicate glass (PSG), borophosphosilicate glass (BPSG), Black Diamond® (Applied Materials of Santa Clara, California), Xerogel, Acrogel, amorphous fluorinated carbon, parylene, BCB, SILK® (Dow Chemical of Midland, Michigan), and/or combinations thereof. The ILD layer may be formed by any suitable process including CVD, PVD, spin-on deposition, and/or other suitable processes.

FIG. 12 illustrate, on the right, a layout diagram of a semiconductor device 100 including a 1-bit SRAM cell, and on the left, a circuit diagram representing part of the 1-bit SRAM cell. Referring to FIG. 12, the device 100 includes fins 106 (including fins 106a-d, 106e' and 106f) that are oriented lengthwise along the "Y" direction and gate stacks 500 that are oriented lengthwise along the "X" direction perpendicular to the "Y" direction. The A-A line of FIG. 12 is the same as the A-A line of FIG. 3. The cut pattern 206 marks the areas of the fins 106 and the well regions 104 to be etched (corresponding to the opening 206 in FIG. 4). In this embodiment, the cut pattern 206 extends from an edge of one gate stack 500 to an edge of another gate stack 500. It is noted that the "cut" process (i.e., etching of the fins 106 and the well regions 104) occurs before the gate stacks 500 are formed. Therefore, the "cut" process does not damage the later-formed gate stacks 500. Further, the gate stacks 500 on both sides of the cut pattern 206 in the PMOS region do not function as a gate as there is no source or drain on one side of the gate, but can function as an interconnect in some embodiments. The fins 106e' and 106f' are equivalent to fins 106e and 106f, respectively, of FIGS. 2-11, but are placed on the left side of the fin 106a. The fins 106e and 106f of FIGS. 2-11 are part of the SRAM cell to the right of one shown in FIG. 12, and are not illustrated in this figure. The well isolation features 404 occupy a space in the well regions 104 corresponding to the cut pattern 206.

Although not intended to be limiting, one or more embodiments of the present disclosure provide many benefits to a semiconductor device and the formation thereof. For example, embodiments of the present disclosure provide well isolation features in a FinFET circuit, particularly, FinFET SRAM cells. The well isolation features reduce leakage between two abutting and oppositely doped well regions, thereby reducing the likelihood of triggering latch-up by PNPN or NPNP structures in the circuit.

In one exemplary aspect, the present disclosure is directed to a method. The method includes receiving a structure that includes a substrate including a first well region having a first dopant type and a second well region having a second dopant type that is opposite to the first dopant type; and fins extending above the substrate. The method further includes forming a patterned etch mask on the structure, wherein the patterned etch mask provides an opening that is directly above a first fin of the fins, wherein the first fin is directly above the first well region. The method further includes etching the structure through the patterned etch mask, wherein the etching removes the first fin and forms a recess in the substrate that spans from the first well region into the second well region; and forming a dielectric material between remaining portions of the fins and within the recess.

In an embodiment, before the forming of the patterned etch mask, the method further includes forming a dielectric liner over the substrate and over top and sidewalls of the fins, wherein the opening exposes the dielectric liner disposed over the top and sidewalls of the first fin.

In an embodiment of the method, a second fin of the fins is directly above the second well region and is next to the first fin along a fin width direction, and the opening is directly above a first portion of the second well region between the first fin and the second fin. In a further embodiment, a width of the first portion is 40% to 60% of a width of the second well region between the first fin and the second fin along the fin width direction.

In an embodiment of the method, the recess is at least 40 nm deep into the substrate from an upper surface of the substrate. In another embodiment, a depth of the recess is controlled using a timer during the etching of the structure. In another embodiment, a first portion of the first well region and the second well region that is removed by the etching is more heavily doped than a second portion of the first well region and the second well region that remains below the recess.

In an embodiment of the method, a top portion of the recess is wider than a bottom portion of the recess. In another embodiment, the first dopant type is N-type, and the second dopant type is P-type. In yet another embodiment, the method further includes removing the patterned etch mask after the etching of the structure and before the forming of the dielectric material.

In another exemplary aspect, the present disclosure is directed to a method. The method includes receiving a structure that includes a substrate including an N-well region and a P-well region abutting the N-well region; and fin structures extending above the substrate the method further includes forming a dielectric liner over an upper surface of the substrate and over top and sidewalls of the fin structures. The method further includes forming a patterned etch mask over the structure, the patterned etch mask having an opening, wherein a first fin structure of the fin structures stands in the opening, wherein the first fin structure is directly above the N-well region. The method further includes etching the first fin structure and the substrate through the opening, wherein the etching forms a recess in the substrate that crosses a boundary between the N-well region and the P-well region; and forming a dielectric material between remaining portions of the fin structures and within the recess.

In an embodiment of the method, the forming of the patterned etch mask includes forming a fill layer over the dielectric liner and surrounding the fin structures; forming a photoresist layer on the fill layer; patterning the photoresist layer to result in a patterned photoresist layer; and etching the fill layer through the patterned photoresist layer to provide the opening.

In another embodiment of the method, each of the fin structures includes a semiconductor fin connected to the substrate and a fin-top hard mask disposed over the semiconductor fin. In yet another embodiment, the opening exposes a portion of the dielectric liner directly above the P-well region.

In an embodiment the method, a distance from an upper surface of the substrate to a bottom surface of the recess is at least 25 nm. In another embodiment, the recess has a tapered profile with top of the recess being wider than bottom of the recess.

In yet another exemplary aspect, the present disclosure is directed to a circuit device. The circuit device includes a substrate that includes a first well region having a first dopant type and a second well region having a second dopant type different from the first dopant type; fins extending from the substrate; a dielectric material disposed between the fins such that the fins extend above a top surface of the dielectric material; and a well isolation feature that includes a portion of the dielectric material that extends into the substrate, wherein a bottom surface of the well isolation feature is below a top surface of the substrate that extends between the well isolation feature and a first fin of the fins.

In an embodiment of the circuit device, the bottom surface of the well isolation feature is at least 40 nm below the top surface of the substrate. In another embodiment, the well isolation feature has rounded bottom corners. In yet another embodiment, the well isolation feature is disposed over both the first well region and the second well region, and wherein a bigger portion of the well isolation feature is disposed over the first well region than over the second well region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate including a first well region having a first dopant type and a second well region having a second dopant type different from the first dopant type, wherein the second well region interfaces with the first well region at an interface;
a first fin, a second fin, and a third fin extending from the substrate, wherein the first fin and the second fin are disposed over the first well region, and the third fin is disposed over the second well region, wherein the second fin is disposed between the first fin and the third fin;
a dielectric liner extending along top surfaces and sidewalls of the first fin, the second fin, and the third fin and comprising a first portion extending along a sidewall of the first fin, a second portion extending along a sidewall of the second fin, and a third portion extending along a sidewall of the third fin; and an isolation feature extending through the dielectric liner and disposed between the first fin and the third fin, wherein the isolation feature comprises an upper portion over the substrate and extending from the first portion of the dielectric liner to the third portion of the dielectric liner, wherein the isolation feature comprises a lower portion extending into the substrate.

2. The semiconductor structure of claim 1, wherein the upper portion of the isolation feature resembles a first rectangle, and the lower portion of the isolation feature resembles a second rectangle, and in a cross-sectional view, the first rectangle is wider than the second rectangle.

3. The semiconductor structure of claim 2, wherein the lower portion of the isolation feature extends into both the first well region and the second well region.

4. The semiconductor structure of claim 2, wherein the lower portion of the isolation feature comprises a first sidewall and a second sidewall opposite the first sidewall, and a distance between the first sidewall and the interface is different than a distance between the second sidewall and the interface.

5. The semiconductor structure of claim 4, wherein the upper portion of the isolation feature comprises a third sidewall and a fourth sidewall opposite the third sidewall, and a distance between the first sidewall and the third sidewall is different than a distance between the second sidewall and the fourth sidewall.

6. The semiconductor structure of claim 1, wherein, in a top view, the second fin terminates at the isolation feature.

7. The semiconductor structure of claim 1, wherein a distance between a bottommost surface of the isolation feature and a top surface of the substrate is no less than 40 nm.

8. The semiconductor structure of claim 1, wherein the isolation feature has rounded bottom corners.

9. The semiconductor structure of claim 1, wherein the first fin comprises a lower portion and an upper portion, and the upper portion of the first fin has a dopant type different from a dopant type of the lower portion of the first fin.

10. The semiconductor structure of claim 9, wherein the dopant type of the lower portion of the first fin is same as the first dopant type of the first well region.

11. A semiconductor structure, comprising:
a substrate comprising an n-type well region and a p-type well region immediately adjacent to the n-type well region;
a first fin and a second fin disposed over the n-type well region, wherein each of the first fin and the second fin comprises an n-type doped bottom portion and a p-type doped top portion on the n-type doped bottom portion;
a third fin and a fourth fin disposed over the p-type well region, wherein each of the third fin and the fourth fin comprises a p-type doped bottom portion and an n-type doped top portion on the p-type doped bottom portion, and wherein the second fin is closer to the p-type well region than the first fin;
a dielectric liner over the substrate, wherein, in a cross-section view, the dielectric liner extends along an entirety of sidewalls of the first, third, and fourth fins;
an isolation feature extending through the dielectric liner and disposed between the first fin and the third fin, wherein the isolation feature comprises:

an upper portion disposed over and next to the dielectric liner, wherein a top surface of the upper portion is below a top surface of the first fin;
a lower portion disposed under the dielectric liner and extending into the substrate, wherein a top surface of the isolation feature is coplanar with an interface between the n-type doped bottom portion of the first fin and the p-type doped top portion of the first fin.

12. The semiconductor structure of claim 11, wherein, when viewed from top, the second fin terminates at the isolation feature.

13. The semiconductor structure of claim 11, wherein the dielectric liner comprises silicon nitride.

14. The semiconductor structure of claim 11, wherein the lower portion of the isolation feature spans over an interface between the n-type well region and the p-type well region.

15. The semiconductor structure of claim 14, wherein the lower portion of the isolation feature comprises a first sidewall and a second sidewall opposite the first sidewall, and a distance between the first sidewall and the interface is different than a distance between the second sidewall and the interface.

16. The semiconductor structure of claim 15, wherein the upper portion of the isolation feature comprises a third sidewall and a fourth sidewall opposite the third sidewall, and a distance between the first sidewall and the third sidewall is different than a distance between the second sidewall and the fourth sidewall.

17. A semiconductor structure, comprising:
a substrate comprising a first-type well region and a second-type well region interfaced with the first-type well region at an interface, a doping polarity of the first-type well region being different from a doping polarity of the second-type well region;
a first fin and a second fin disposed over the first-type well region and extending lengthwise along a first direction;
a third fin and a fourth fin disposed over the second-type well region, wherein the second fin is disposed between the first fin and the third fin;
a first gate structure intersecting both the first fin and the second fin;
a second gate structure intersecting both the third fin and the fourth fin, the second gate structure being spaced apart from the first gate structure;
a fin isolation feature extending from the first fin to the third fin, wherein, in a top view, the second fin terminates at the fin isolation feature along the first direction; and
a well isolation feature disposed under the fin isolation feature, extending into the substrate, and spanning over the interface, wherein the well isolation feature comprises a first sidewall surface and a second sidewall surface opposite the first sidewall surface, and a distance between the first sidewall surface and the interface is different than a distance between the second sidewall surface and the interface.

18. The semiconductor structure of claim 17, wherein the fin isolation feature comprises a third sidewall surface and a fourth sidewall surface opposite the third sidewall surface, and a distance between the third sidewall surface and the first sidewall surface is greater than a distance between the fourth sidewall surface and the second sidewall surface.

19. The semiconductor structure of claim 17, further comprising: a dielectric liner next to a sidewall surface of the first fin and on a top surface of the substrate, wherein, the fin isolation feature is spaced apart from the first fin and the substrate by the dielectric liner.

20. The semiconductor structure of claim 17, wherein a bottom portion of the first fin has a dopant type different from a bottom portion of the third fin.

* * * * *